United States Patent [19]

Dishon et al.

[11] Patent Number: 4,862,411
[45] Date of Patent: Aug. 29, 1989

[54] MULTIPLE COPY DATA MECHANISM ON SYNCHRONOUS DISK DRIVES

[75] Inventors: Yitzhak Dishon, Stamford, Conn.; Michelle Y. Kim, Scarsdale, N.Y.

[73] Assignee: International Business Machines Corporation, Armonk, N.Y.

[21] Appl. No.: 19,407

[22] Filed: Feb. 26, 1987

[51] Int. Cl.⁴ .................. G11B 52/00; G11B 38/00; G11B 5/86
[52] U.S. Cl. .................. 364/952; 364/248; 360/73.03; 360/15
[58] Field of Search .................. 364/200, 900; 360/73.01, 73.03, 73.02, 15

[56] References Cited

U.S. PATENT DOCUMENTS

| | | | |
|---|---|---|---|
| 3,999,163 | 12/1976 | Levy et al. | 364/200 |
| 4,183,084 | 2/1980 | Lawson | 364/200 |
| 4,210,959 | 7/1980 | Wozmik | 364/200 |
| 4,410,942 | 10/1983 | Milligan et al. | 364/200 |
| 4,471,272 | 9/1984 | Ohno | 360/73 |
| 4,471,457 | 9/1984 | Videki, II | 364/900 |
| 4,618,897 | 10/1986 | Johnson et al. | 360/73.03 |
| 4,638,425 | 1/1987 | Harfung | 364/200 |
| 4,727,509 | 2/1988 | Johnson et al. | 364/900 |

Primary Examiner—Parshotam S. Lall
Assistant Examiner—Tuan A. Duong
Attorney, Agent, or Firm—Jack M. Arnold

[57] ABSTRACT

At least two direct access storage devices (DASDs), which are predetermined to record the same data from a central processing unit (CPU), are normally kept synchronzied with each other except during the power up phase. The DASD synchronization is controlled and maintained by synchronization control means independent of any commands from the CPU. When one or more commands such as SEEK and SET SECTOR or LOCATE commands are transferred from the CPU to a control unit over a single data transfer path between them, desired identical records on the synchronized DASDs are concurrently located while the DASDs are disconnected from the data transfer path. Upon locating the desired identical records, the DASDs are reconnected to the data transfer path. Then, a WRITE command is transferred from the CPU to the control unit for concurrently recording the same data onto the synchronized DASDs at the desired record locations. Thus, at the conclusion of this recording, when status information is reported to the host CPU, it is assured that multiple copies of the same data are recorded onto the synchronized DASDs.

14 Claims, 5 Drawing Sheets

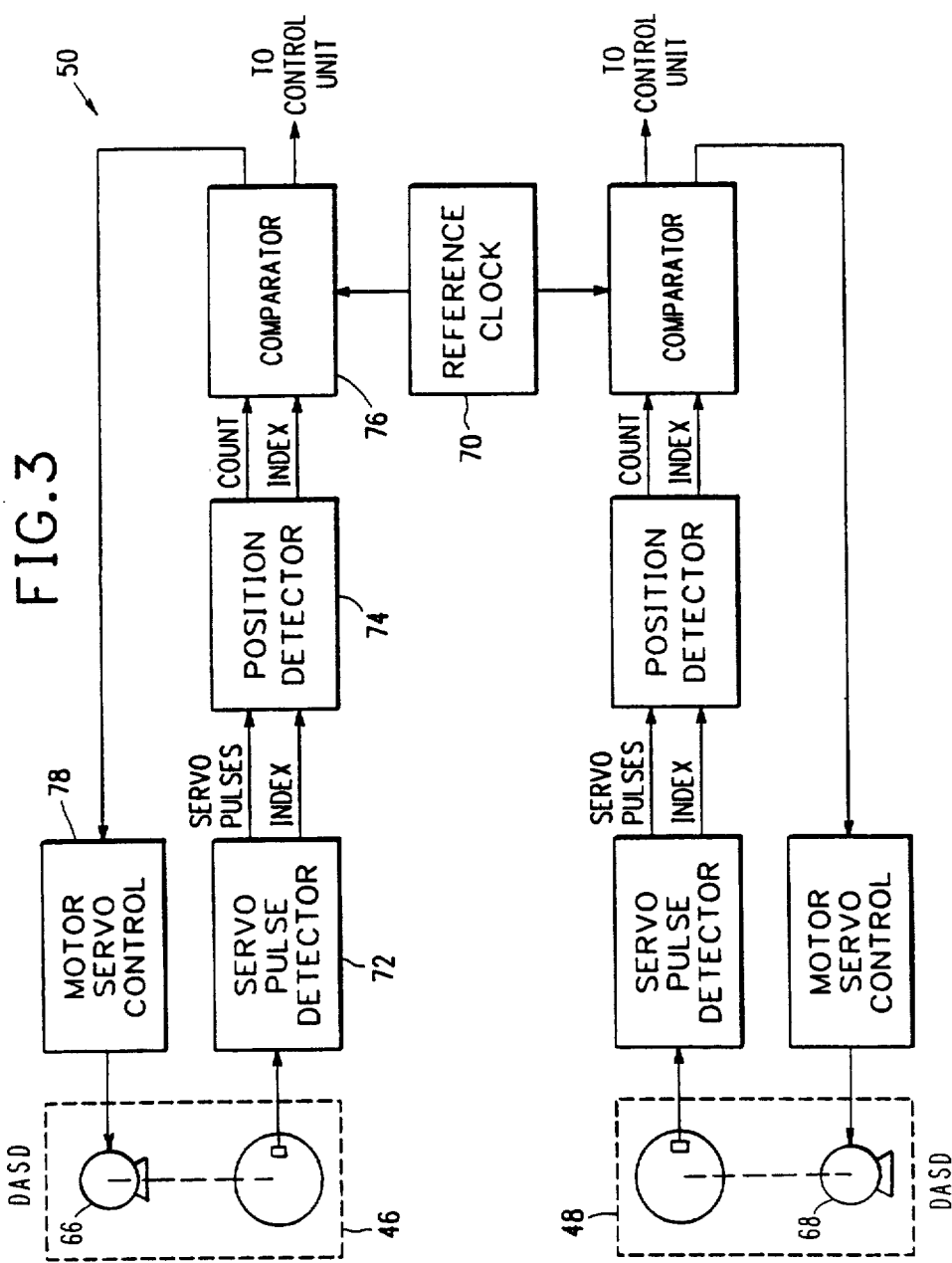

FIG. 5  NORMAL SERVO PULSE TRAIN
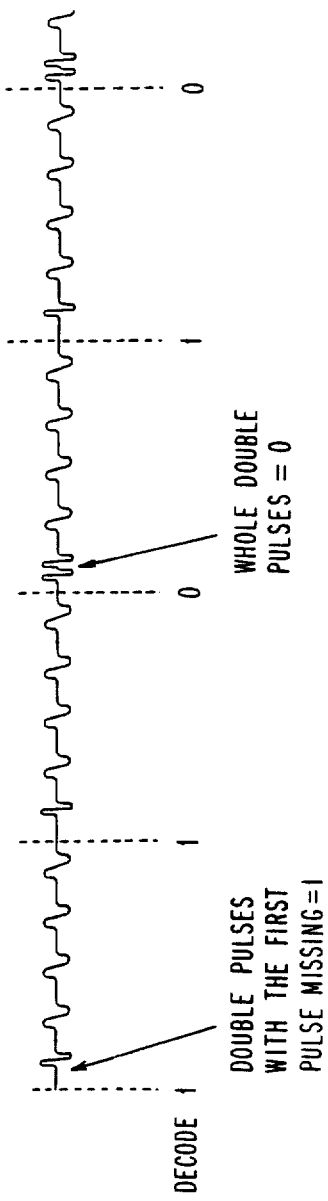
FIG. 6  INDEX CODED SERVO PULSES

MULTIPLE COPY DATA MECHANISM ON SYNCHRONOUS DISK DRIVES

TECHNICAL FIELD

This invention relates to a method and apparatus for controlling the transfer of data between a host central processing unit (CPU) and a direct access storage device (DASD) subsystem and, more particularly, to such a method and apparatus for concurrently recording multiple copies of the same data from a CPU onto multiple DASDs so as to maintain continuous operations of a data processing system.

BACKGROUND OF THE INVENTION

An input/output (I/O) subsystem such as a DASD subsystem attached to a host CPU has a critical relationship to overall data processing system performance and availability. It is essential for high performance that the DASD subsystem provides rapid access to its DASDs for performing desired data processing operations. Furthermore, to maintain continuous operation of the system, the DASD subsystem should provide data integrity (no loss of data) and data availability (recovery in the case of a failure).

A conventional approach to these problems, for example, involves generating multiple copies of the same data and recording them onto multiple volumes of DASDs. For high data availability, these DASDs are preferably arranged to be independent of each other in respect to electrical power, mechanical movement and data transfer paths. In the case of a DASD failure, the data is available on another DASD that contains an identical copy of the data recorded on the failed DASD, thereby allowing the data processing system to continue its operations using such valid data. In the conventional approach, however, such recording of duplexed data takes place sequentially, thus imposing a performance penalty on the data processing system.

One example of this approach is disclosed in U.S. Pat. No. 4,453,215 to Reid, which is directed to a fault tolerant computer system comprising redundant components such as CPUs, buses, control units and DASDs. The system of this patent, while recording duplexed data onto a pair of DASDs, is not capable of concurrently recording the data onto these DASDs because this patent specifically recognizes that the DASDs do not operate in synchronism with one another. That is, the disclosed system necessarily incurs the performance penalty outlined below when the duplexed data is recorded onto the DASDs.

Another type of DASD subsystem, employed in a widely used data processing system such as the IBM System/370, provides several data transfer paths between a CPU and DASDs. A data transfer path is formed by the interconnection of the CPU to a control unit via a channel and the control unit to a DASD via a defined interface, as well known in the art. More than one data transfer path may be available to the same or different control units. Conventionally, the aforementioned approach is implemented such that multiple copies of the same data are recorded by accessing each DASD separately over a single data transfer path being formed by a channel and a control unit.

This implies that, in an implementation using a single data transfer path, the duplexed recording takes place truly sequentially because, in this case, separate chains of Channel Command Words (CCWs) are sequentially transferred from the CPU over the data transfer path to achieve such recording, i.e., DASDs are rendered to operate sequentially of one another. In the worst case, for each DASD accessed, time is spent sequentially for seek, rotational latency, and then data transmission.

In another implementation using multiple data transfer paths, even when the CPU attempts to record the duplexed data onto multiple DASDs concurrently, this does not always take place. The reasons for this problem are:

(1) Separate chains of CCWs, as described earlier, are asynchronously transferred from the CPU to multiple control units.

(2) Data transfer paths to the DASDs are not necessarily available at the same time. For example, when a single copy of data is about to be recorded onto one of the DASDs, the data transfer path to another DASD may be busy with another operation. In this case, it is normally impossible to predict the precise time when the data transfer path to another DASD becomes free.

(3) Rotational latency of one of the DASDs may be different from that of another DASD at a given time. This causes the multiple DASDs to record the same data at different times.

For these reasons, the approach so implemented does not allow the concurrent recordation of the duplexed data onto the multiple DASDs. Though the recordation of duplexed data is allowed in an overlapped manner in certain situations, there is no practical way to predict the degree of overlapping nor exact timing of such recording.

Thus, the overall performance of a data processing system using the conventional approach is significantly impaired. The conventional approach is disadvantageous in that, at the conclusion of recording the first copy, when its associated status information is reported to the host CPU, there is no assurance that another copy of the same data is recorded or available at that time. Thus, if such assurance is required, the CPU must wait for conclusion of recording of another copy, with a resulting performance penalty.

SUMMARY OF THE INVENTION

It is, therefore, an object of the invention to provide a method and apparatus which improves the overall performance of a data processing system by concurrently recording multiple copies of the same data from a host CPU onto a plurality of DASDs, using only one data transfer path between the CPU and a control unit.

In accordance with the invention, at least two DASDs which are predetermined to record the same data from the CPU are normally kept rotationally synchronized with each other except during the power up phase. The DASD synchronization is controlled and maintained by synchronization control means independent of any commands from the CPU. When one or more CCWs such as SEEK and SET SECTOR or LOCATE are transferred from the CPU to the control unit over a single data transfer path between them, desired identical records on the synchronized DASDs are concurrently located while the DASDs are disconnected from the data transfer path. Upon locating the desired identical records, the DASDs are reconnected to the data transfer path. Then, a WRITE CCW is transferred from the CPU to the control unit for concurrently recording the same data onto the synchronized DASDs at the desired record locations. Thus, at the conclusion of this recording, when status information is reported to the host CPU, it is assured that multiple copies of the same data are recorded onto the synchronized DASDs.

BRIEF DESCRIPTION OF THE DRAWINGS

The invention will be described further, by way of a preferred example thereof, with reference to the accompanying drawings wherein like reference numerals have been used in the several views to depict like elements. In said drawings:

FIG. 3 is a block diagram of an internal configuration of the synchronization control unit of FIG. 1;

FIG. 5 is a timing diagram showing a normal servo pulse train recorded on the DASD servo surface of FIG. 4;

FIG. 6 is a timing diagram showing a unique servo pulse train with index coded servo pulses;

DESCRIPTION OF THE INVENTION

The present invention will hereinafter be described in detail with reference to FIGS. 1 to 8.

Figure 1:
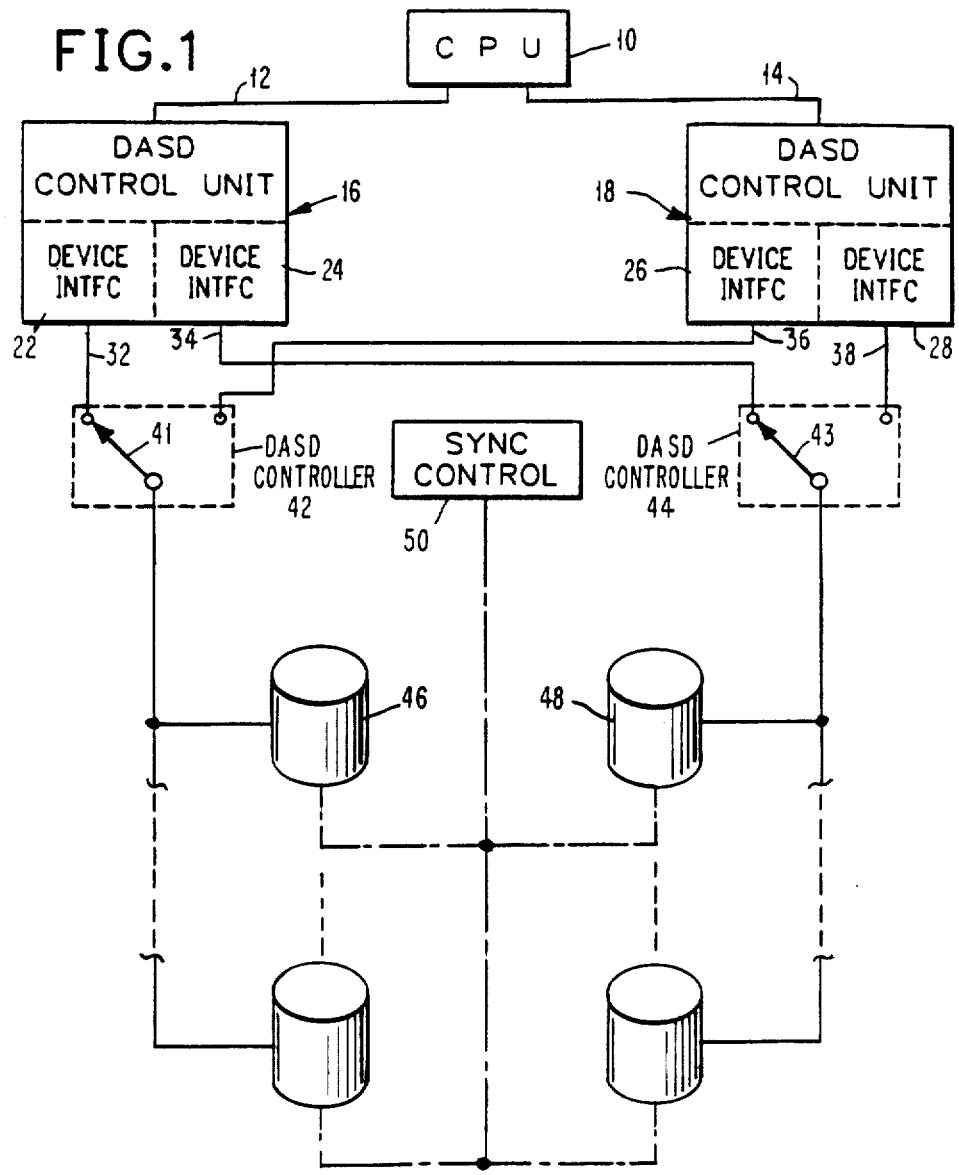
FIG. 1 is a schematic block representation of a data processing system according to the invention.

Referring first to FIG. 1, there is shown a block representation of a data processing system in accordance with the invention. The system includes a host central processing unit (CPU) 10 which is connected to control units 16 and 18 over channels 12 and 14 respectively. It is seen that control unit 16 is provided with a pair of device interfaces 22 and 24, while control unit 18 is provided with another pair of device interfaces 26 and 28. (Control units 16 and 18 are mutually backing each other up, in addition to their normal usage.) These device interfaces 22 to 28 are suitable cross-connected to direct access storage device (DASD) controllers 42 and 44 over their associated paths 32 to 38 in order to facilitate the use of an alternate transfer path should a channel or a control unit fail. Each of DASD controllers 42 and 44 includes, in addition to an attachment logic and sequence control (not shown), a switch means for allowing its associated DASDs on the same string to be switched between control units as follows.

When the switch means 41 and 43 of DASD controllers 42 and 44, respectively, are set to the logical left positions as shown in FIG. 1, a pair of independent paths between control unit 16 and a predetermined pair of DASDs, 46 and 48 for example, will be established simultaneously under the control of control unit 16, as will become more apparent. Similarly, when these switch means are switched to the logical right positions (for example, in the case of a failure of channel 12 and/or control unit 16), another pair of independent paths between control unit 18 and DASDs 46, 48 will be established in the same manner.

An example of a control unit including a device interface that could be used is an IBM 3880 Storage Control Unit. DASDs 46 and 48, including DASD controllers 42 and 44, could be for example an IBM 3380 DASD. The operations of the IBM 3880 Storage Control Unit and IBM 3380 DASD are well known in the art.

Between two strings of DASDs, as represented by 46 and 48, there is provided a synchronization control unit 50. Its configuration will be described in detail with reference to FIG. 3. For the moment, it is sufficient to point out that synchronization control unit 50 includes a feedback mechanism that allows control unit 50 to monitor the speed and rotational position of each of the DASDs 46 and 48 and to adjust the rate of revolution, thereby keeping DASDs 46 and 48 synchronized with each other within a predefined acceptable tolerance at all times (except during the power up phase). Further, in order to compensate for the mechanical tolerance allowed in the DASD synchronization, a pair of synchronization buffers are provided in each of control units 16 and 18 respectively, as will become more apparent.

Figure 2:
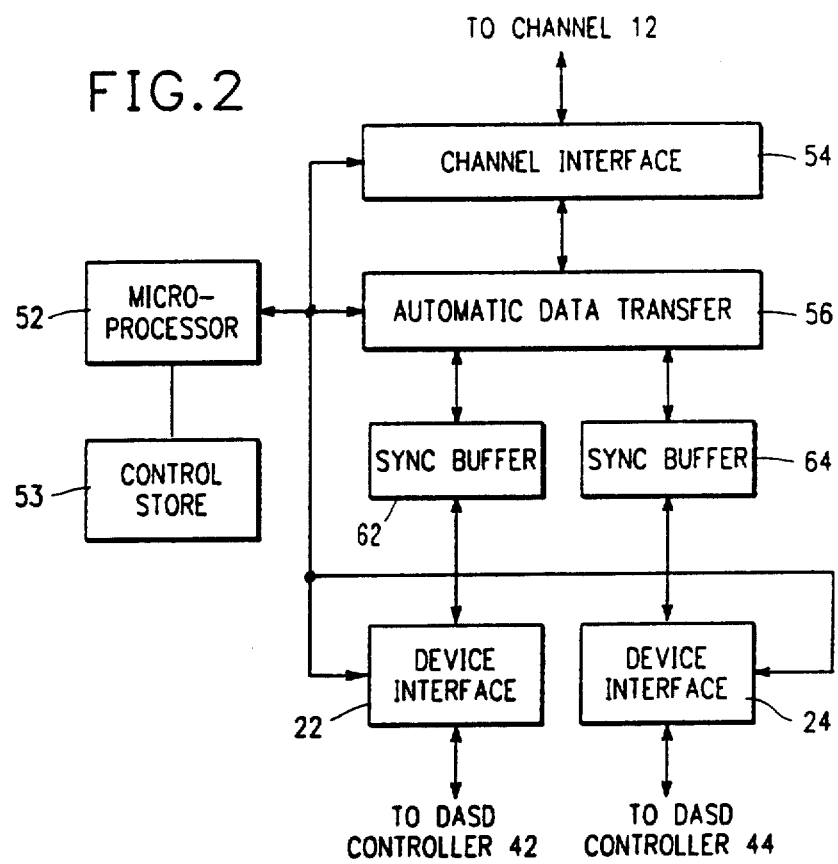
FIG. 2 is a schematic block representation of an essential part of each control unit of FIG. 1, which concurrently records the duplexed data onto a pair of direct access storage devices (DASDs)

Referring to FIG. 2, there is shown a schematic block diagram of an essential part of control unit 16 to concurrently record the duplexed data onto DASDs 46 and 48. Control unit 18 is identical to control unit 16 and no detailed description thereof will be provided.

As shown, control unit 16 comprises a microprocessor 52 with a control store 53, a channel interface 54 to channel 12, device interface 22 and 24 to DASD controllers 42 and 44, respectively, an automatic data transfer mechanism 56, and synchronization buffers 62 and 64. Channel interface 54 to channel 12, in conjunction with control from microprocessor 52, facilitates communication with channel 12 to accept selection, transfer of CCWs from channel 12 to control unit 16, transfer of status from control unit 16 to channel 12 and transfer of data in either direction, as well known in the art. Further, control unit 16 initiates commands on device interfaces 22 and 24 to concurrently move each of DASD actuator mechanisms (SEEK), initialize each of DASDs 46 and 48 to compare a required sector against the actual sector currently under the DASD actuator (SET SECTOR), read or write any of the Count, Key or Data fields (where such architecture is implemented) or other fixed length fields (where the block architecture is implemented). Control unit 16 also includes capabilities to compare the contents of a field read from DASD 46 or 48 against data received from channel 12 and to respond with "low", "equal" or "high" status.

Data transfer is accomplished by first moving concurrently each of the DASD actuators to the desired track, then waiting for a pre-defined sector to occur under the head, which, when DASDs 46 and 48 are synchronized, occurs concurrently on both DASDs 46 and 48. The data transfer path is normally disconnected while these operations go on, and reconnected at their conclusion, meanwhile being free for other operations. Following this, a count field is read from one of the DASDs, assuming that both DASDs contain identical data. Data from this count field is compared with data available from channel 12 and when comparing as required, the following field may be read or written. If the operation is a READ (as dictated by a READ CCW from channel 12), data read from either one of DASDs 46 or 48 is eventually presented on channel interface 54. In this case, there is not need to read the same data from both of DASDs 46, 48. If the operation is a WRITE, data to be written is received from channel 12, stored in synchronization buffers 62 and 64, and then presented on device interfaces 22 and 24.

When required, control unit 16 also performs error correction on data read, normally only on count fields. In addition, control unit 16 performs extensive diagnostic operations and ancilliary functions to facilitate efficient service and maintenance of both control unit 16 and the DASDs attached thereto.

Synchronization buffers 62 and 64, as shown, allow the concurrent accumulation of data transferred from CPU 10 to control unit 16 via channel 12, which is then stored simultaneously into both synchronization buffers 62 and 64. Depending on small differences of synchronization between DASDs 46 and 48, device interfaces 22 and 24 respectively provide data to be recorded to DASDs 46 and 48 connected thereto as required from the associated synchronization buffers 62 and 64, thus making it possible to compensate for small differences in rotational position of DASDs 46 and 48 due to acceptable tolerance in their synchronization.

More specifically, a WRITE command is transferred from channel 12 to control unit 16 in the gap preceding the desired record. Data is then transferred from CPU 10 to control unit 16 via channel 12. Control unit 16 and its device interfaces 22 and 24 are already synchronized (at bit and byte level) to the desired record in each DASD. Data received from channel 12 is first stored simultaneously into both synchronization buffers 62 and 64. The data is then taken from synchronization buffers 62 and 64, and transferred concurrently to DASDs 46 and 48 over device interfaces 22 and 24 respectively, as required by the internal synchronization mechanism associated with each interface. Such transfer of data to DASD over the device interface is well known in the art. The availability of two individual synchronization buffers 62, 64 in conjunction with device interfaces 22, 24 makes it possible to tolerate small differences in rotational synchronization between DASDs 46 and 48, and to accomplish bit and byte synchronization uniquely with each of the two DASDs over their corresponding device interfaces 22 and 24. The size of storage space in each synchronization buffer is greater than the corresponding number of bytes associated with the tolerance in rotational synchronization. That is, the size of each synchronization buffer is a function of linear recording density (bytes/inch translatable into byte/rotational degree) and the rotational synchronization tolerance expressed in degrees.

Referring next to FIG. 3, there is shown a block diagram illustrating an internal configuration of rotational synchronization control 50 of FIG. 1. As shown, its upper portion associated with DASD 46 is identical to the lower portion associated with DASD 48, and no detailed description of the latter will be provided unless otherwise noted.

The synchronization of all DASD motors, for example 66 and 68, within a system is accomplished using a central reference clock 70 and servo pulses prerecorded on a special servo surface of each DASD. Reference clock 70 serves as a reference to establish rotational speed and rotational position for each DASD in the subsystem, such that all DASDs rotate at the same rate (within an acceptable tolerance) and are at the same relative rotational position. Clock pulses from reference clock 70 are distributed to all DASDs, for example 46 and 48, of the subsystem that need to be in rotational and positional synchronism with each other.

Figure 4:
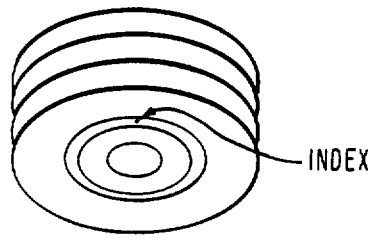
FIG. 4 is a schematic illustration of a DASD platter assembly and servo surface showing the position of an index.

As shown in FIGS. 4, 5 and 6, each DASD is provided with a servo surface for recording servo pulses. There are servo pulses corresponding to each track of the DASD. These servo pulses are used for actuator positioning, track following, and rotational orientation such as sector and index, as well known in the art. A special read/write head is provided to read/write the servo pulses. Typically, the servo pulses recorded include a unique pattern encoded by pulses of twice the frequency (double pulses) to indicate the position of the DASD index. In FIG. 6, for example, such double pulses are used to encode an index pattern once per revolution of the DASD. In the illustrated example, the code is 1-1-0-1-0, where a 1 is encoded by omitting one of the double pulses and a 0 by providing both of them.

It should be noted, however, that details of the servo pulses are not important to the invention. The important point is that the servo pulses are available on existing DASDs that can be used to detect rate of rotation and rotational position, which can then be used to synchronize multiple DASDs in accordance with the invention.

Figure 7:
FIG. 7 is a timing diagram showing a train of reference clock pulses and double width pulses representing "index", generated by the reference clock unit of FIG. 3.

The output of reference clock 70 is generated by a suitably stable crystal oscillator and counters to provide a train of reference clock pulses at a rate such that it is equal to the rate of the servo pulses recorded on the servo surface of each DASD, when the DASD rotates at the desired speed. (Different embodiments may use other ratios of reference clock pulse rate to servo pulse rate.) Further, corresponding to the location of the DASD index, a "reference index" is inserted in the reference clock pulse train, with a pattern of pulses different from the clock pulses, as for example with double width pulses, as shown in FIG. 7. (Other encodings of such reference index are possible, including representation as a discrete signal.) That is, the "reference index" is comprised of at least one pulse, different than other reference clock pulses. This "reference index" pulse (s) indicates the earliest and latest permissible occurrence of DASD index, when the DASD is synchronized to the reference clock with an acceptable tolerance. By counting the reference clock pulses between the DASD indices, it is thus possible to establish the time corresponding to one revolution of a DASD. By detecting the reference index pulse, it is possible to establish in time the occurrence of the DASD index.

Servo pulse detector 72 receives the output of the read/write head associated with the servo surface of DASD 46, at the track at which its actuator is currently located. These pulses are essentially analog in nature, as shown in FIGS. 5 and 6. Servo pulse detector 72 includes a servo signal amplifier, and a phase locked oscillator (PLO). The PLO is locked to the frequency of the servo pulses, and its output are digital pulses corresponding to the analog servo pulses read. This arrangement is normally found with every DASD and is well known in the art. Further, the occurrence of servo pulses corresponding to the DASD index is detected by an appropriate index detection means as well known in the art and a digital pulse is provided to indicate the DASD index.

Position detector 74 contains a counter that counts the digital pulses provided by servo pulse detector 72. Thus, this count corresponds to the rotational position of DASD 46, and also to the rate of its rotation, if referenced to elapsed time. The counter is reset periodically as required, for example at occurrence of the DASD index.

Comparator 76 contains a counter that counts input pulses from reference clock 70. This count corresponds to elapsed time from a previous reference point, for example elapsed time from the reference index. The counter is reset periodically as required, for example once per revolution at occurrence of the reference index. Periodically, the count of reference clock pulses is compared with the count of the servo pulses in position detector 74. If the count of the reference clock pulses is higher than the count of the servo pulses, DASD 46 is rotating too slow, if the count of the reference clock pulses is less than the count of the servo pulses, DASD 46 is rotating too fast. The numeric magnitude of the difference is a measure of the phase error between DASD 46 and reference clock 70.

The error indication is fed to motor servo control 78 where the result is further processed in accordance with feedback servo mechanism theory to either accelerate or decelerate DASD motor 66. This processing includes comparing previous and current values of rate of rotation as established by the difference of the counts as described above, and calculating a difference signal for DASD motor 66 such as to either accelerate or decelerate it, and further avoiding oscillations, and overshoot or undershoot in the servo system. The rate of sampling and correction is a function of the motor's physical characteristics. The design of such servo control is well known in the art.

The detection of the reference index from reference clock 70 and the DASD index from the servo pulses makes it possible to synchronize DASDs 46 and 48 as to the rotational position, such that the DASD indices occur concurrently on DASDs 46 and 48, and consequently also any other rotational position, within an acceptable tolerance. To accomplish this, each DASD is first accelerated until its DASD index as indicated by the servo pulses, and the reference index, as indicated by reference clock 70, occur concurrently. Following that, each DASD is synchronized as to rotational speed, utilizing the error indication and either accelarating or decelarating the rotational speed until the error indication is within an acceptable value.

Comparator 76 provides signals to control unit 16 to indicate whether or not DASD 46 is synchronized with reference clock 70 and further the system is given indication when to start synchronization, as for example after power up or upon specific indication from control unit 16. These signals are transferred to and from microprocessor 52 in FIG. 2 via device interfaces 22 and 24, although no detailed interconnection is shown in FIG. 1 or 2 for sake of clarity of these drawings.

While the lower portion of synchronization control 50 shown in FIG. 3 is not described in detail, it will be understood that this portion functions in substantially the same manner as the upper portion thereby to synchronize DASD 48 with reference clock 70. Further, it is noted that, in this configuration, DASD motors 66 and 68 may be DC brushless motors or motors of other type that allow electrical control of the rate of revolution.

From the above description, it can be seen that DASD synchronization is controlled and maintained by the arrangement of FIG. 3 independent from CPU 10. Further, it is apparent that synchronization buffers 62 and 64 in control unit 16 (and their counterparts in control unit 18) can be used to compensate for the mechanical tolerance in the DASD synchronization, as fully described with reference to FIG. 2.

Figure 8:
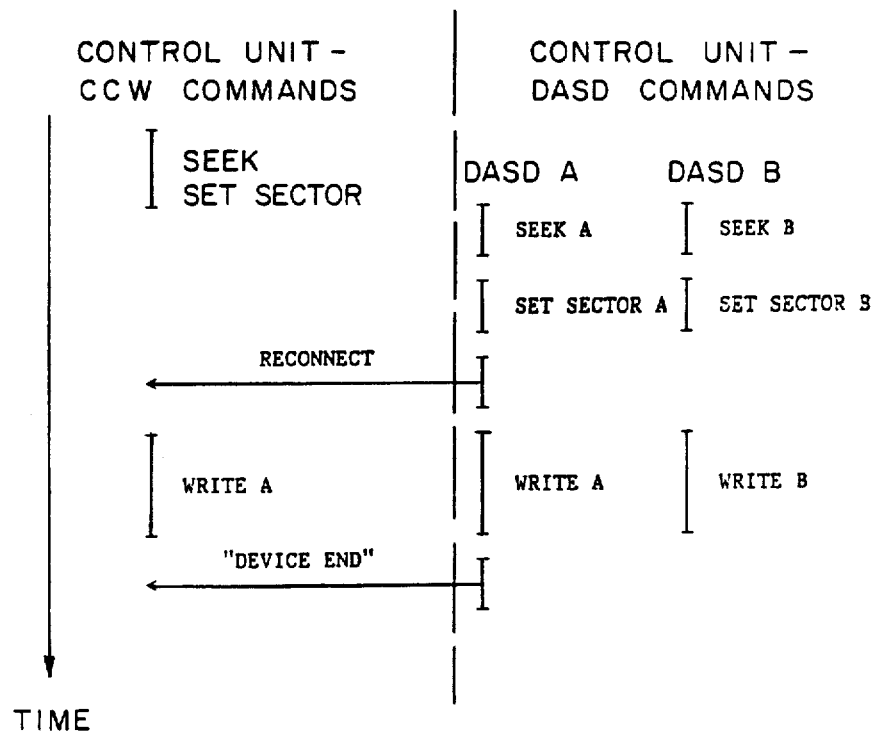
FIG. 8 shows an outline of a set of commands from a central processing unit (CPU) or a channel to a control unit and from the control unit to DASDs, to be executed in the data processing system of FIG. 1 for implementing the approach according to the invention.

The operation of the data processing system of the invention, as shown in FIG. 1, may be understood by reference to FIG. 8 which illustrates how the inventive approach using a single data transfer path is implemented in relation to a series of commands, identified in the well known IBM System/370 architecture as Channel Command Words (CCWs). It is assumed herein that the DASD subsystem used the Count-Key-Data (CKD) architecture for recording data.

As well known in the art, I/O operations for DASDs in FIG. 1 are initiated when CPU 10 invokes a START I/O instruction from a main memory (not shown). Briefly, this instruction serves in this environment to a particular DASD, which control unit 16 then actually associates with at least a pair of DASDs, 46 and 48 for example, and to establish a data transfer path including, for example, channel 12, control unit 16 and the selected pair of DASDs 46 and 48. A chain of CCWs is then transferred from the main memory of CPU 10 to control unit 16 over channel 12 for accessing DASDs 46 and 48 and for effectuating any data movement across the data transfer path. Thus, the concurrent transfer of data to two separate DASDs remains transparent to the CPU 10 and its controlling programs.

Referring to FIG. 8, the CCWs transferred may be either SEEK and SET SECTOR commands or a LOCATE command, not shown. These commands are transferred to control unit 16 over channel 12 for locating desired identical records on DASDs 46 and 48. In this case, since DASDs 46 and 48 are rotationally synchronized with each other and contain the identical data, they can be initiated concurrently for SEEK and SET SECTOR operations by control unit 16 over device interfaces 22 and 24 while they are disconnected from channel 12. The seek and rotational delays of DASDs 46 and 48 then occur concurrently, thus eliminating the additional performance penalty otherwise imposed on the data processing system, if the DASDs were not synchronized.

The SEEK operation is carried out by initiating mechanical motion of the respective DASD actuators to reach the desired tracks containing the desired identical records. Channel 12 and control unit 16 are disconnected from DASDs 46 and 48 while the actuators are moving to their new positions. When the actuators have reached the desired tracks, the control unit carries out the SET SECTOR operation. This operation, utilized on DASDs equipped with the well known Rotational Position Sensing feature, involves having DASDs 46 and 48 indicate when their recording heads are over predetermined sectors which are closely adjacent to the sectors containing the desired records. When these predetermined sectors rotate past the recording heads, DASDs 46 and 48 so indicate to control unit 16 which then requests reconnection to CPU 10 via channel 12. When reconnected, a subsequent WRITE command may be issued and executed.

Upon receipt of the WRITE command, two independent device interfaces 22 and 24 to DASDs 46 and 48 now allow the concurrent transfer of data, received from CPU 10, for recording onto DASDs 46 and 48 concurrently. This process continues until the appropriate count of bytes to be recorded is complete, at which time the WRITE operation is terminated and "DEVICE END" status information is sent to channel 12 from control unit 16 indicating the DASDs 46 and 48 (appearing to CPU 10 as one DASD) are now available for subsequent use. Thus, at the conclusion of recording, when "DEVICE END" status information is reported to CPU 10, it is assured that both copies of the same data are actually recorded onto DASDs 46 and 48. Thus, the invention also eliminates the uncertainty of second copy availability, associated with the conventional approach, after status information as above has been reported by one DASD.

While the invention has been described with respect to a particular embodiment thereof, it will be apparent to those skilled in the art that modifications and variations in the present invention can be made without departing from its spirit and scope. For example, the disk motors could be synchronized by obtaining positional and rotational speed information directly from the motor by various means such as encoding shaft rotation.

Having thus described our invention, what we claim as new, and desire to secure by Letters Patent is:

1. A method for concurrently recording identical data from a central processing unit onto a plurality of direct access storage devices over a single data transfer path between said central processing unit and a single control unit, said single control unit having a plurality of device interfaces, with each such device interface communicating with a different one of said direct access storage devices, the method comprising the steps of:
    initiating and maintaining rotational synchronization of said plurality of direct access storage devices with one another;
    transferring a given set of commands from said central processing unit to said single control unit over said single data transfer path for concurrently locating desired identical records on each of said synchronized direct access storage devices through said plurality of device interfaces; and
    upon locating said desired records, transferring a write command from said central processing unit to said single control unit over said data transfer path for concurrently recording said identical data onto locations of said desired records on said plurality of synchronized direct access storage devices over said data transfer path and said plurality of device interfaces.

2. A method according to claim 1, wherein said direct access storage devices are presented as one logical I/O device to be selected by said central processing unit.

3. A method according to claim 1, wherein said synchronization initiating and maintaining step comprises the steps of:
    (a) sensing by each direct access storage device servo pulses and an index pulse pattern recorded on a servo track of each of said direct access storage devices and generating digital servo pulses and a digital index pulse indicative thereof for each revolution of the direct access storage device;
    (b) a single clock source, for cyclically generating a train of reference clock pulses at a predetermined rate corresponding to such rate of said digital servo pulses that occurs when each of said direct access storage devices rotates at a desired speed, said train of reference clock pulses including at least one reference index pulse at a position where said digital pulse index should occur in time;
    (c) periodically comparing, by each of said direct access storage devices, a count of said digital servo pulses between said digital index pulses with a count of said reference clock pulses between said reference index pulses and generating an error signal indicative of a difference of the counts; and
    (d) providing said error signal to corresponding one of said direct access storage devices for either accelerating or decelerating the same so as to reduce said error signal.

4. A method according to claim 3, wherein said step (b) includes inserting said at least one reference index pulse into said train of reference clock pulses as a unique pulse pattern, different from said reference clock pulses.

5. A method according to claim 1, wherein said write command transferring step further comprises:
    temporarily storing identical data within a plurality of data buffer means in said control unit respectively for compensating the tolerance allowed in synchronization of said direct access storage devices, each data buffer means being associated with a different one of said direct access storage devices.

6. A method according to claim 1, further comprising the steps of:
    presenting a status signal from said control unit to said central processing unit upon completion of execution of said write command for indicating concurrent completion of recording said identical data onto said synchronized direct access storage devices.

7. A method according to claim 1, further comprising the step of:
    transferring a read command from said central processing unit to said control unit over said transfer path for reading a desired record from any one of said synchronized direct access storage devices.

8. A system for concurrently recording identical data from a central processing unit onto a plurality of direct access storage devices over a single data transfer path between said central processing unit and a single control unit, said single control unit having a plurality of device interfaces, with each such device interface communicating with a different one of said direct access storage devices, said system comprising:
    means for initiating and maintaining rotational synchronization of said plurality of direct access storage devices with one another;
    means for transferring a given set of commands from said central processing unit to said single control unit over said single data transfer path for concurrently locating desired identical records on each of said synchronized direct access storage devices through said plurality of device interfaces; and
    means, responsive to locating said desired records, for transferring a write command from said central processing unit to said control unit over said single data transfer path for concurrently recording said identical data onto locations of said desired records on said plurality of synchronized direct access storage devices over said single transfer path and said plurality of device interfaces.

9. A system according to claim 8, wherein said direct access storage devices are presented as one logical I/O device to be selected by said central processing unit.

10. A system according to claim 8, wherein said means for initiating and maintaining synchronization comprises:
    means included in each direct access storage device for sensing servo pulses and an index pulse pattern recorded on a servo track of each of said direct access storage devices and for generating digital servo pulses and a digital index pulse indicative thereof for each revolution of the direct access storage device;

a single timing means for cyclically generating a train of reference clock pulses at a predetermined rate corresponding to such rate of said digital servo pulses that occurs when each of said direct access storage devices rotates at a desired speed, said train of reference clock pulses including a reference index pulse at a position where said digital index pulse should occur in time;

means for periodically comparing, by each of said direct access storage devices, a count of said digital servo pulses between said digital index pulses with a count of said reference clock pulses between said reference index pulses and for generating an error signal indicative of a difference of the counts; and means for providing said error signal to corresponding one of said direct access storage devices for either accelerating or decelerating the same so as to reduce said error signal.

11. A system according to claim 10, wherein said reference index pulse is inserted into said train of reference clock pulses as a unique pulse pattern, different from said reference clock pulses.

12. A system according to claim 8, wherein said control unit is provided with a plurality of data buffer means, with each such data buffer means being associated with a different one of said direct access storage devices, and wherein said means for transferring a write command temporarily stores said identical data within said data buffer means respectively for compensating the tolerance allowed in synchronization of said direct access storage devices.

13. A system according to claim 8, further comprising:

means for presenting a status signal from said control unit to said central processing unit upon completion of execution of said write command for indicating concurrent completion of recording said identical data onto said synchronized direct access strorage devices.

14. A system according to claim 8, further comprising:

means for transferring a read command from said central processing unit to said control unit over said transfer path for reading a desired record from either one of said synchronized direct access storage devices.

* * * * *